United States Patent
Le Ravalec et al.

(10) Patent No.: US 9,709,697 B2
(45) Date of Patent: Jul. 18, 2017

(54) METHOD FOR EXPLOITING A GEOLOGICAL RESERVOIR BY MEANS OF A MATCHED RESERVOIR MODEL CONSISTENT WITH THE FLOW PROPERTIES

(71) Applicant: IFP Energies nouvelles, Rueil-Malmaison (FR)

(72) Inventors: Mickaele Le Ravalec, Rueil-Malmaison (FR); Christophe Preux, Acheres (FR); Guillaume Enchery, Rueil-Malmaison (FR); Arnaud Lange, Rueil-Malmaison (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 761 days.

(21) Appl. No.: 14/184,730

(22) Filed: Feb. 20, 2014

(65) Prior Publication Data

US 2014/0236549 A1 Aug. 21, 2014

(30) Foreign Application Priority Data

Feb. 21, 2013 (FR) .................................... 13/51.509

(51) Int. Cl.
G06G 7/48 (2006.01)
G01V 99/00 (2009.01)
E21B 43/16 (2006.01)
G01V 9/00 (2006.01)
G06F 17/50 (2006.01)

(52) U.S. Cl.
CPC .............. *G01V 99/005* (2013.01); *E21B 43/16* (2013.01); *G01V 9/00* (2013.01); *G06F 17/5009* (2013.01)

(58) Field of Classification Search
CPC ...... G01V 99/005; G01V 99/00; E21B 43/16; G06F 17/50; G06F 17/5009
See application file for complete search history.

(56) References Cited

U.S. PATENT DOCUMENTS

| | | | | |
|---|---|---|---|---|
| 2009/0254325 A1* | 10/2009 | Gokdemir | ............... | E21B 49/00 703/10 |
| 2010/0299125 A1* | 11/2010 | Ding | ..................... | E21B 43/12 703/10 |
| 2012/0253770 A1* | 10/2012 | Stern | ..................... | G01V 11/00 703/10 |

OTHER PUBLICATIONS

Le Ravalec-Dupin, Mickaele et al., "Cosimulation as a Perturbation Method for Calibrating Porosity and Permeability Fields to Dynamic Data", 2011, Computers & Geosciences 37, Elsevier, Ltd.*

Suzuki Satomi et al., "Pattern-Based Approach to Multiphase Flow Upscaling Using Distance-Based Clustering", Oct. 30-Nov. 2, 2011, SPE Annual Technical Conference and Exhibition, Society of Petroleum Engineers.*

(Continued)

*Primary Examiner* — Cedric D Johnson
(74) *Attorney, Agent, or Firm* — Fitch, Even, Tabin & Flannery LLP

(57) ABSTRACT

The invention relates to a method for exploiting (EX) a geological reservoir according to an exploitation scheme (SE) defined on the basis of a matched reservoir model (CAL) with static data and dynamic data. For this method, a first reservoir model (MR) displaying a certain consistency with respect to the flow properties of the medium is preselected. This preselected model (MR) is then used as starting point for the history matching process (CAL).

34 Claims, 5 Drawing Sheets

(56) References Cited

OTHER PUBLICATIONS

Caers, Jef, "Geostatistical History Matching under Training-Image Based Geological Model Constraints", Sep. 29-Oct. 2, 2002, SPE Annual Technical Conference and Exhibition, Society of Petroleum Engineers.*

Le Ravalec, M. et al., "Advanced Integrated Workflows for Incorporating Both Production and 4D Seismic-Related Data into Reservoir Models", 2012, Oil & Gas Science and Technology—Rev. IFP Energies nouvelles, vol. 67.*

Rolando, J. P., "From Well Data to 3D Models: Determination of the Critical Path in the Process of Characterization of Reservoirs", 1998, SPE Annual Technical Conference and Exhibition, Society of Petroleum Engineers, Inc.*

Le Ravalec, Mickaele, et al: "The FFT Moving Average (FFT-MA) Generator: An Efficient Numerical Method for Generating and Conditioning Gaussian Simulations," Mathematical Geology, 32(6), pp. 701-723.

Ramarao, Bands S., et al: "Pilot Point Methodology for Automated Calibration of an Ensemble of Conditionally Simulated Transmissivity Fields," 1. Theory and Computational Experiments, Water Resources Research, vol. 31, No. 3, pp. 475-493,Mar. 1995.

Gomez-Hernanez, J. Jaime, et al: "Stochastic Simulation of Transmissivity Fields Conditional to Both Transmissivity and Piezometric Data—I. Theory," Journal of Hydrology, 203, pp. 162-174.

Hu, Lin Y: 2000 "Gradual Deformation and Iterative Calibration of Gaussian-Related Stochastic Models," Mathematical Geology, vol. 32, No. 1., Jan. 2000, pp. 87-108 (submitted pp. 1-32).

Caers, Jef: 2003, "Geostatistical History Matching Under Training-Image Based Geological Constraints," SPE J. 8(3), pp. 218-226 (sub. pp. 1-39).

Goovaerts, P., 1997, "Geostatistics for Natural Resources Evaluation," Oxford Press, New York, (Entire Book).

* cited by examiner

METHOD FOR EXPLOITING A GEOLOGICAL RESERVOIR BY MEANS OF A MATCHED RESERVOIR MODEL CONSISTENT WITH THE FLOW PROPERTIES

CROSS REFERENCE TO RELATED APPLICATION

Reference is made to French Application Serial No. FR 13/51.509, filed Feb. 21, 2013, which application is incorporated herein by reference in its entirety.

BACKGROUND OF THE INVENTION

Field of the Invention

The present invention relates to the oil industry, and more particularly, the exploitation of underground reservoirs, such as oil reservoirs or gas storage sites.

Description of the Prior Art

The optimization and the exploitation of an oil deposit relies on a description that is as accurate as possible of the structure, of the petrophysical properties, of the fluid properties, etc., of the deposit being studied. For this, the experts use a software tool which makes it possible to take account of these aspects in an approximate manner known as the reservoir model. Such a model constitutes a mock-up of the subsoil, representative both of its structure and of its behavior. Generally, this type of mock-up is represented on a computer by execution of a computer program which is then called a numerical model. A reservoir model comprises a meshing or grid, generally three-dimensional, associated with one or more maps of petrophysical properties (facies, porosity, permeability, saturation, etc.). The association assigns values of these petrophysical properties to each of the meshes of the grid.

These models, which are well known and widely used in the oil industry, make it possible to determine numerous technical parameters relating to the study or exploitation of a reservoir, of hydrocarbons for example. In practice, when the reservoir model is representative of the structure of the reservoir and of its behavior, the engineer uses it for example to determine the areas which have the greatest chances of containing hydrocarbons, the areas in which it may be interesting/necessary to drill an injection or production well to improve the recovery of the hydrocarbons, the type of tools to be used, the properties of the fluids used and recovered, and so on. These interpretations of reservoir models in terms of "exploitation technical parameters" are well known. Similarly, the modeling of the $CO_2$ storage sites makes it possible to monitor these sites, to detect unexpected behaviors and to predict the movement of the injected $CO_2$.

The function of a reservoir model is therefore to best account for all the information known concerning a reservoir. A reservoir model is representative when a reservoir simulation supplies numerical responses that are very close to the history data already observed. History data is the term used to designate the production data obtained from measurements on the wells in response to the production from the reservoir (production of oil, production of water from one or more wells, breakthrough time, gas/oil ratio (GOR), proportion of production water ("water cut"), and/or the repetitive seismic data (4D seismic impedances in one or more regions, etc.)).

A reservoir simulation is a technique that makes it possible to simulate the fluid flows within a reservoir by software executed on a computer known as a "flow simulator", and of the reservoir model. For example, the PumaFlow® (IFP Energies nouvelles, France) and ECLIPSE® (Schlumberger, United States) software packages are flow simulators.

For this, the integration of all the available data is essential. These data generally comprise:
measurements at certain points of the geological formation of the property modeled, for example in wells. These data are called static because they do not vary over time (on the timescale of the production from the reservoir) and are directly linked to the property of interest.
"history data", comprising production data, for example the fluid flow rates measured on the wells, the concentrations of tracers and data obtained from seismic acquisition campaigns repeated at successive times. These data are called dynamic because they change during exploitation and are indirectly linked to the properties assigned to the meshes of the reservoir model.

The available static data are used to define random functions for each petrophysical property such as porosity or permeability. A representation of the spatial distribution of a petrophysical property is a realization of a random function. Generally, a realization is generated from a germ or a series of random numbers. Numerous simulation techniques exist, such as the Gaussian sequential simulation method, the Cholesky method or even the FFT-MA (fast Fourier transform with moving average) method. The following documents describe such methods:

Goovaerts, P., 1997, Geostatistics for Natural Resources Evaluation, Oxford Press, New York.

Le Ravalec M., Ncetinger B., and Hu L.-Y., 2000, The FFT Moving Average (FFT-MA) Generator: An Efficient Numerical Method for Generating and Conditioning Gaussian Simulations, Mathematical Geology, 32(6), 701-723.

The techniques for integrating the dynamic data (production and/or 4D seismic) in a reservoir model are well known and are so-called "history matching" techniques. History matching modifies the parameters of a reservoir model, such as the permeabilities, the porosities or the skins of wells (representing damage around the well), the fault lines, etc., to minimize the differences between the measured history data and the corresponding responses simulated on the basis of the model by using a flow simulator. The parameters can be linked to geographic regions, like the permeabilities or porosities around one or more wells. The difference between real data and simulated responses forms a functional called an "objective function." The history matching problem is resolved by minimizing this functional. Reservoir model perturbation techniques make it possible to modify a realization of a random function while ensuring the fact that the perturbed realization is also a realization of this same random function. Perturbation techniques that can be cited include the pilot points method developed by RamaRao et al. (1995) and Gomez-Hernandez et al. (1997), the gradual deformations method proposed by Hu (2000) and the probability perturbation method introduced by Caers (2003). These methods make it possible to modify the spatial distribution of the heterogeneities:

RamaRao, B. S., Lavenue, A. M., Marsilly, G. de, Marietta, M. G., 1995, Pilot Point Methodology for Automated Calibration of an Ensemble of Conditionally Simulated Transmissivity Fields. 1. Theory and Computational Experiments. WRR, 31(3), 475-493.

Gomez-Hernandez, J., Sahuquillo, A., and Capilla, J. E., 1997, Stochastic Simulation of Transmissivity Fields Conditional to Both Transmissivity and Piezometric Data, 1. Theory, J. of Hydrology, 203, 162-174.

Hu, L-Y., 2000, Gradual Deformation and Iterative Calibration of Gaussian—Related Stochastic Models, Math. Geol., 32(1), 87-108.

Caers, J., 2003, Geostatistical History Matching Under Training-Image Based Geological Constraints. SPE J. 8(3), 218-226.

The determination of a matched reservoir model that observes the production data is very adversely affected by the computation times required. In practice, the matching process involves a very large number of iterations. For each of them, the model is given as input to a flow simulator and the computed responses are compared to the available production data. Now, the computation time for a simulation is generally of the order of a few hours. Consequently, the experts seek to limit the number of history matching iterations to limit the computation time and cost (simulations) while obtaining a reservoir model that is representative of the geological reservoir.

SUMMARY OF THE INVENTION

The invention relates to a method for exploiting a geological reservoir according to an exploitation scheme defined on the basis of a matched reservoir model with static data and dynamic data. In order to reduce the number of iterations of the history matching process, a first reservoir model that displays a certain consistency with respect to the flow properties of the medium is preselected. This preselected model is then used as starting point for the matching process and makes it possible to obtain a model that reproduces all the production data in a reduced number of iterations.

The invention makes it possible to modify representations of the reservoir, called reservoir models, to make them consistent with the various data collected in the field.

The invention relates to a method for exploiting a geological reservoir according to an exploitation scheme defined on the basis of a reservoir model, the reservoir model comprising a meshing associated with at least one parameter of the reservoir, the reservoir being passed through by at least one production well and at least one injection well for the injection of at least one fluid into the reservoir for which dynamic data are acquired during exploitation. For this method, the following steps are performed:

a) a first reservoir model is generated, for which the breakthrough time estimated by the first reservoir model is representative of the breakthrough time measured for the reservoir wherein the breakthrough time is the time elapsed for the injected fluid to be detected at the production well;

b) the reservoir model is constructed by modifying the first reservoir model with the following steps:
  i) determining an objective function that measures a difference between the acquired dynamic data and the dynamic data simulated by the reservoir model and a flow simulator;
  ii) the step i) is reiterated to minimize the objective function after having modified the reservoir model;

c) an optimal exploitation scheme is determined for the reservoir by simulating the exploitation of the reservoir by the reservoir model and the flow simulator; and d) the reservoir is exploited by implementing the optimal exploitation scheme.

According to the invention, the breakthrough time is determined by a shortest path computation algorithm.

Advantageously, the first reservoir model is generated by the following steps:

(1) determining a mathematical relationship between the breakthrough time and a flow distance according to the shortest path between the injection well and the production well;

(2) generating randomly at least one initial reservoir model;

(3) determining for the initial reservoir model the flow distance according to the shortest path between the injection well and the production well determined by use of a shortest path computation algorithm constrained by the parameters of the initial reservoir model;

(4) estimating the breakthrough time for the initial reservoir model by use of the flow distance and of the mathematical relationship;

(5) comprising the estimated breakthrough time to the measured breakthrough time; and (6) determining whether the initial reservoir model is representative by the comparison, in which case the initial reservoir model is selected as first reservoir model and, if not, the steps (2) to (5) are reiterated.

Advantageously, the mathematical relationship between the breakthrough time and the flow distance is determined by performing the following steps:

(a) generating randomly at least one primary reservoir model;

(b) determining for each primary reservoir model at least one flow distance according to the shortest path by use of the shortest path computation algorithm;

(c) determining for each primary reservoir model the breakthrough by a simulation of the primary reservoir model and of the flow simulator; and (d) determining the mathematical relationship between the breakthrough time and the flow distance from each determined flow distance and breakthrough time.

Preferably, the mathematical relationship is a linear function.

According to one embodiment of the invention, the shortest path computation algorithm is the Dijkstra algorithm.

Advantageously, the length of a link between two adjacent meshes i and j used by the shortest path algorithm is defined by a formula of the type:

$$Length_{i \to j} = \frac{\sqrt{Vp_i \times Vp_j}}{T_{i \leftrightarrow j}(P_i - P_j)} \text{ with } T_{i \leftrightarrow j} = \frac{A_{ij} K_{ij}}{D_{ij}}$$

with: $T_{i \leftrightarrow j}$ is the transmissivity between the meshes i and j;
$A_{ij}$ is the intersection surface area between the meshes i and j;
$D_{ij}$ is the distance between the meshes i and j;
$K_{ij}$ is the mean permeability along the connection between the meshes i and j;
$Vp_i$ is the porous volume of the mesh i;
$Vp_j$ is the porous volume of the mesh j;
$P_i$ is the fluid pressure in the mesh i; and
$P_j$ is the fluid pressure in the mesh j.

Furthermore, prior to the determination of the objective function, an upscaling of the reservoir model can be performed for the simulation.

According to the invention, the objective function measures the error between the flow rate of the fluid measured at the production well and the flow rate of the fluid simulated at the production well.

Advantageously, the reservoir model is modified by a gradual deformations method, a pilot points method or a probability perturbation method.

Furthermore, the invention relates to a computer program product that can be downloaded from a communication network and/or stored on a computer-readable medium and/or which is executed by a processor, comprising program code instructions for implementing the method as described above, when the program is executed on a computer.

BRIEF DESCRIPTION OF THE INVENTION

Other features and advantages of the method according to the invention will emerge upon reading the following description of nonlimiting exemplary embodiments, with reference to the appended figures described below.

Figure 3A:
Figure 3B:
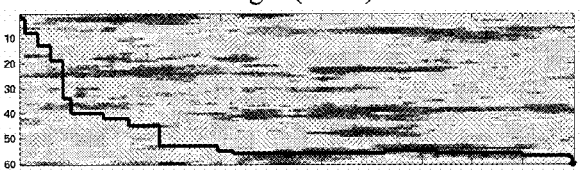
Figure 3C:
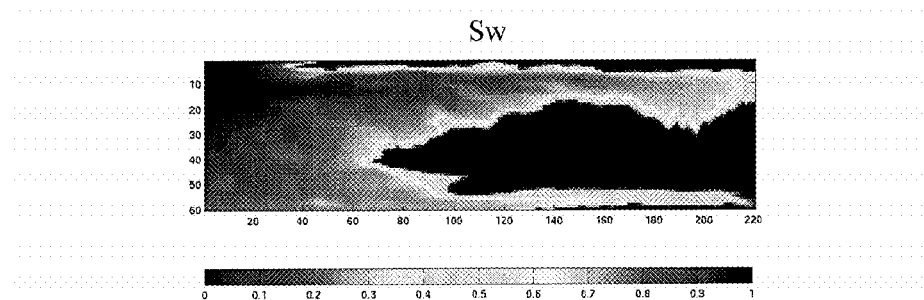

FIGS. 3a) and 3b) illustrate shortest paths for an example according to two shortest path computation methods. FIG. 3c) represents the water saturation at the breakthrough time simulated for the example of FIGS. 3a) and 3b).

Figure 4:
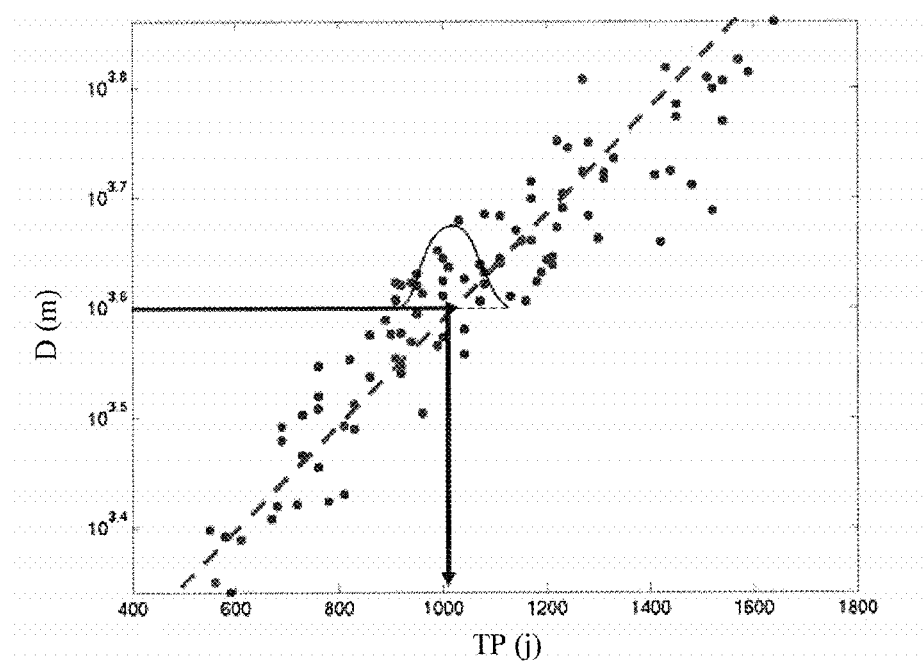

FIG. 4 illustrates a correlation between the breakthrough time and the shortest path distance.

Figure 5:
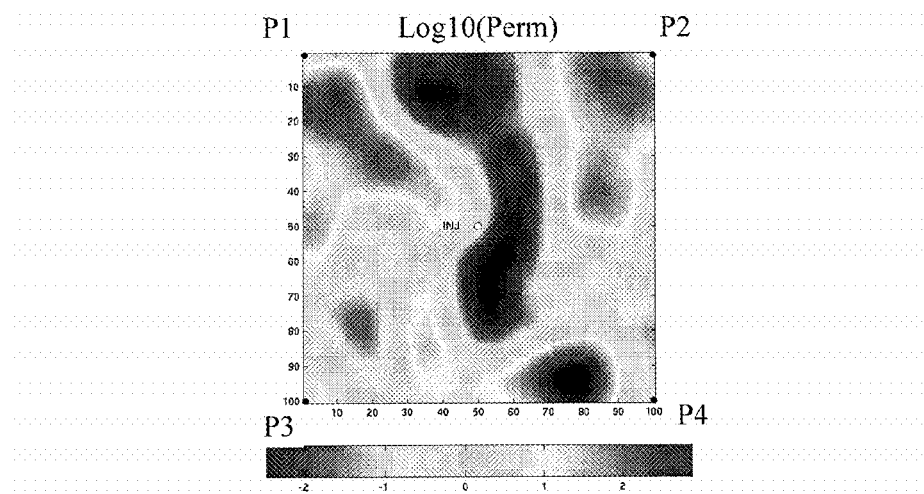

FIG. 5 represents a permeability field for an example.

Figure 6:
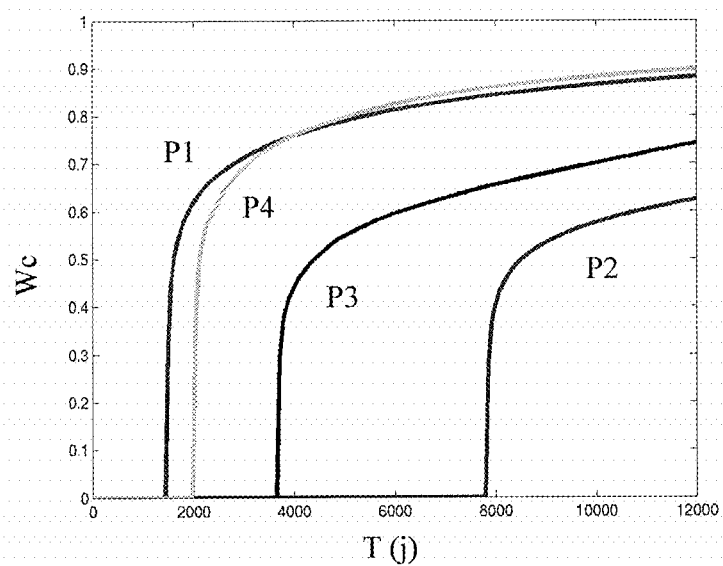

FIG. 6 illustrates the water flow rates simulated at four production wells for the example of FIG. 5.

Figure 7A:
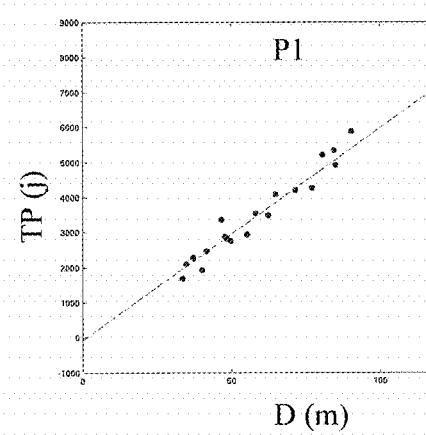
Figure 7B:
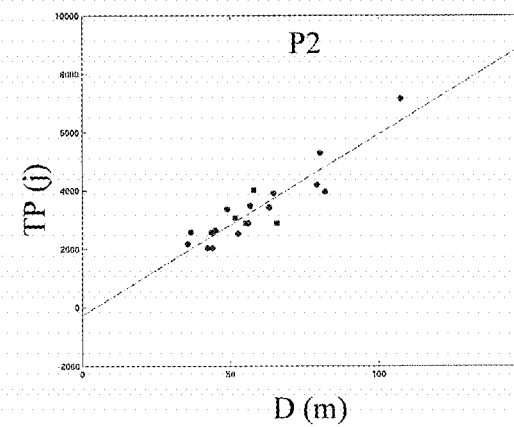
Figure 7C:
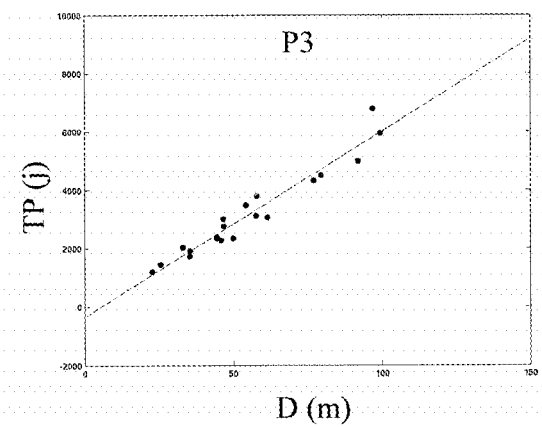
Figure 7D:
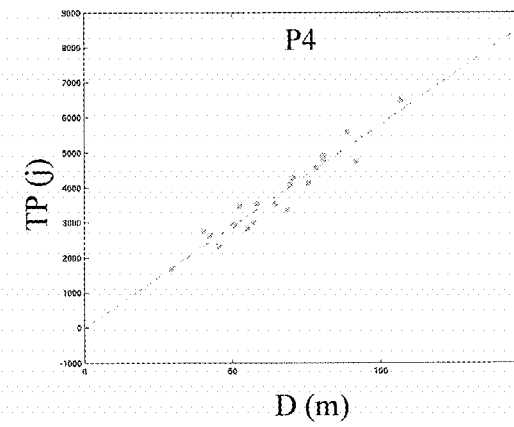

FIGS. 7a) to 7d) illustrate the correlations between the breakthrough time and the shortest path distance for the four wells of the example of FIG. 5.

Figure 8:
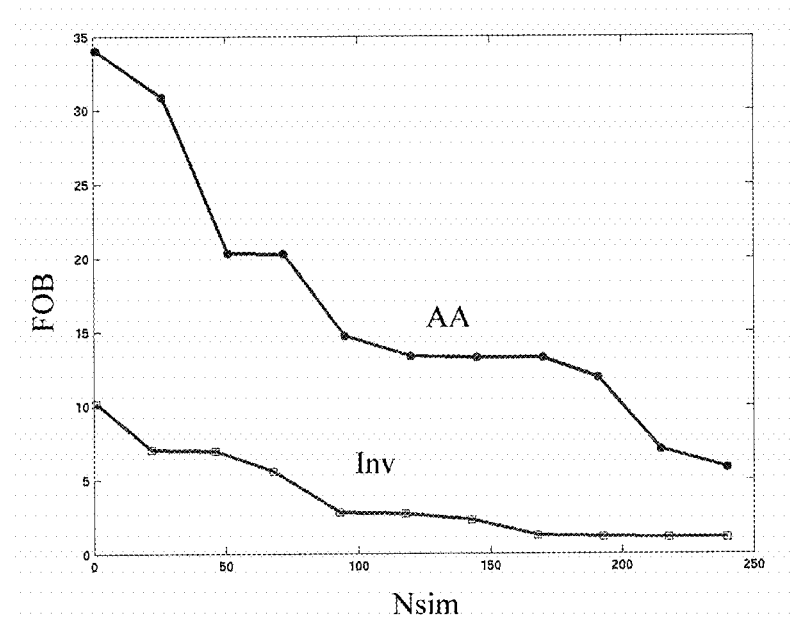

FIG. 8 is a curve of the objective function as a function of the number of simulations for the method according to the prior art and for the method according to the invention for the example of FIG. 5.

DETAILED DESCRIPTION OF THE INVENTION

The invention relates to a method for exploiting a geological reservoir, notably a reservoir containing hydrocarbons. The geological reservoir is passed through by at least one production well and at least one injection well, for the injection of at least one fluid (for example water) into the reservoir. The term "hydrocarbons" should be understood, within the meaning of the present invention, to mean oil-bearing products such as oil or crude oil, petroleum or extra-heavy oil, asphaltenic sands, bituminous schists and gases present in a subterranean formation. The method according to the invention is also suited to the exploitation of gas storage reservoirs, such as $CO_2$ reservoirs. For the reservoir being studied, static data (for example the permeability and porosity) and dynamic data (for example production and seismic data), but also the breakthrough times, are known. The breakthrough times correspond to the times at which the first traces of the injected fluid (water, tracers, etc.) are detected at the production wells.

By the method according to the invention, an exploitation scheme for the reservoir is defined by a flow simulation for a reservoir model representative of the petrophysical and geological properties of the reservoir. The reservoir model that is used is determined by a history matching process from a preselected, relevant first reservoir model. Relevant reservoir models are preselected by concentrating on the breakthrough times.

For this application, the terms: "first reservoir model", "initial reservoir model" and "primary reservoir model" designate all the reservoir models as defined in the introductory part of this application. The adjective used (first, initial, primary) does not indicate any difference in the construction of these models, but makes it possible to differentiate them according to their role. In practice, the first reservoir model is used in the matching process, the initial reservoir model is used in choosing the first reservoir model and the primary reservoir model is used to determine the relationship between the breakthrough time and the flow distance according to the shortest path.

Figure 1:
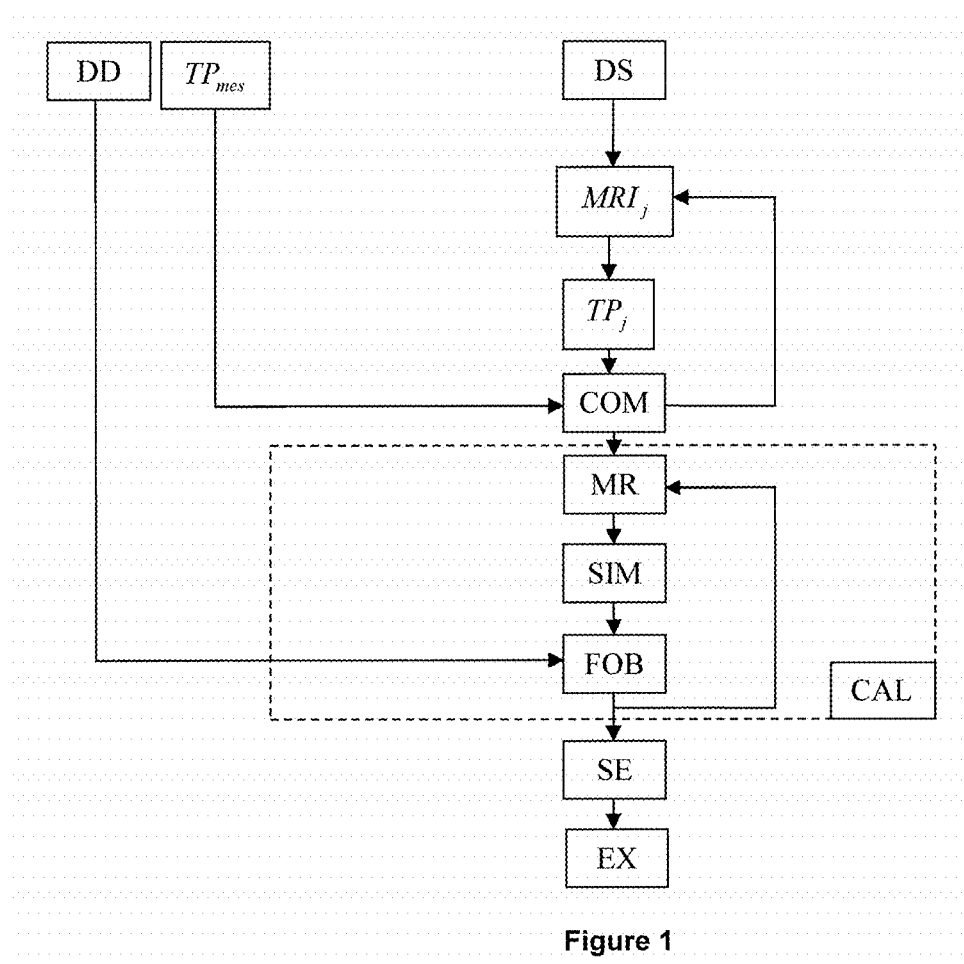
FIG. 1 illustrates a flow diagram of the method according to the invention.
Figure 2:
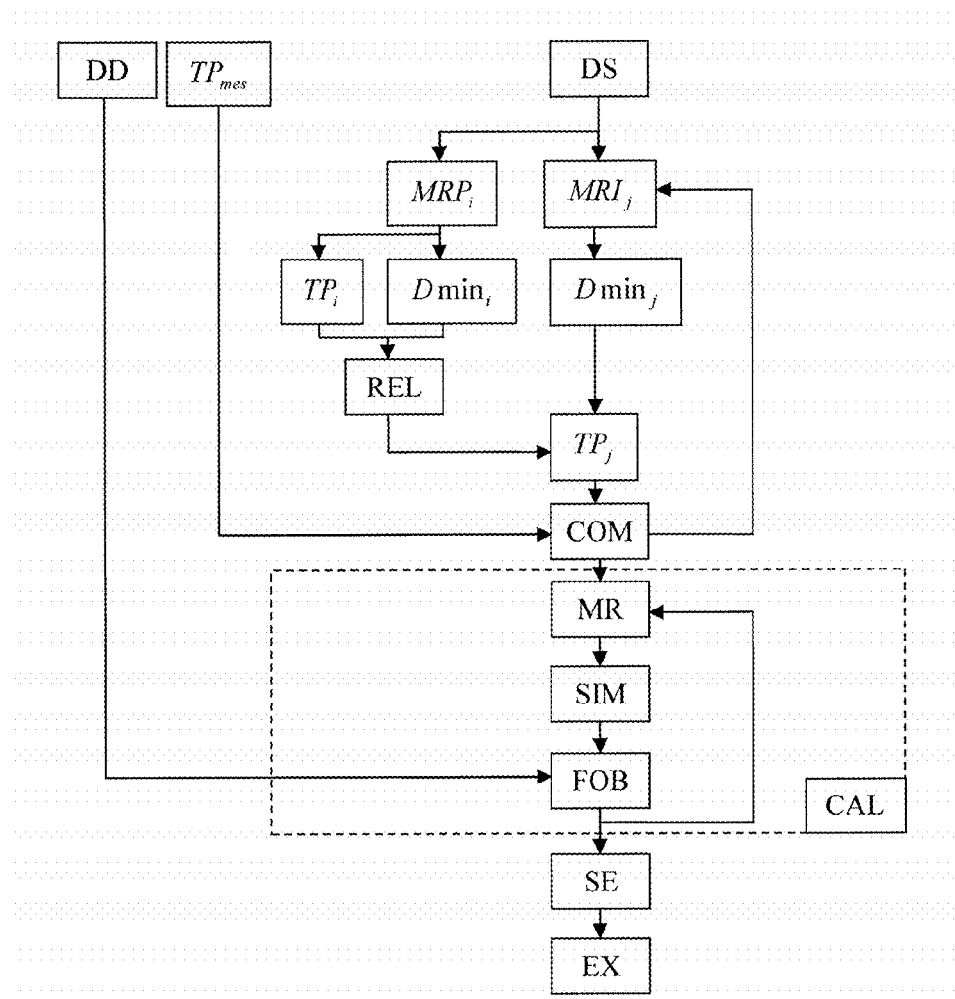
FIG. 2 illustrates a flow diagram of the method according to an embodiment of the invention.

FIG. 1 represents a first embodiment of the method according to the invention, for which the following steps are performed:

1) construction of a first reservoir model (MR)
2) minimization of the objective function (FOB)
3) determination of the exploitation scheme (SE)
4) exploitation of the reservoir (EX) according to the embodiment of FIG. 1, described in more detail below, the step of generation of a first reservoir model (MR) is performed by choosing an initial reservoir model ($MRI_j$) for which the estimated breakthrough time ($TP_j$) is close to the estimated breakthrough time ($TP_{mes}$) for which the estimation is made by a mathematical relationship (REL). According to a second embodiment, as illustrated in FIG. 2 and described in more detail below, the estimation is made by a mathematical relationship (REL) determined by flow distances ($Dmin_i$) and simulated breakthrough times ($TP_i$) determined from primary reservoir models ($MRP_i$).

1) Construction of a First Reservoir Model (MR)

According to the method according to the invention, a first reservoir model is preselected such that the breakthrough time estimated for this first reservoir model is consistent with the measured breakthrough time. The reservoir models are determined randomly according to static data, notably by geostatistical simulations. The analysis of the available static data (DS) (geological, petrophysical and geophysical) makes it possible to define an a priori probability law. The reservoir model generation therefore makes random draws according to this probability law and thus generating reservoir models by chance by use of a suitable software.

According to a first alternative embodiment of the method according to the invention (see FIG. 1), the flows in the reservoir can be simulated by a flow simulator and selection from a number of reservoir models, the first reservoir model for which the breakthrough time is closest to the measured breakthrough time.

According to a second alternative embodiment of the method according to the invention as illustrated in FIG. 2, the following steps are implemented:

(1) a mathematical relationship (REL) is determined between the breakthrough time and a flow distance according to the shortest path between the injection well and the production well, the mathematical relationship (REL) being advantageously a function linking the breakthrough time and the flow distance according to the shortest path with this function being linear, a polynomial, or of a similar type;
(2) at least one initial reservoir model ($MRI_j$) is randomly generated according to the static data (DS);
(3) for the initial reservoir model, the flow distance ($Dmin_j$) according to the shortest path is determined by a shortest path computation algorithm constrained by the parameters of the initial reservoir model;

(4) the breakthrough time ($TP_j$) for the initial reservoir model is estimated by applying the mathematical relationship (REL) to the determined flow distance;

(5) the estimated breakthrough time ($TP_j$) is compared (COM), notably by its difference from the measured breakthrough time ($TP_{mes}$); and (6) a determination is made whether the initial reservoir model is representative of the geological reservoir by the comparison (COM), in which case the initial reservoir model is preselected as first reservoir model, and if not, the steps (2) to (5) are reiterated, by generating a new initial reservoir model ($MRI_j$). Advantageously, it is considered that the initial reservoir model is representative if the difference between the estimated breakthrough time and the measured breakthrough time is small, that is to say less than 15%, preferably less than 10%, of the measured breakthrough time. According to a second alternate embodiment, the breakthrough time is computed for a predetermined number of reservoir models and the one which minimizes the difference is selected. Other criteria can be used.

This embodiment makes it possible to limit the use of the flow simulator, and therefore limit the computation time.

Advantageously, according to one possible implementation of the second alternative embodiment as illustrated in FIG. 2, the mathematical relationship (REL) can be determined by implementing the following steps:

(a) at least one (preferably a predetermined number) primary reservoir model ($MRP_i$) is randomly generated according to the static data (DS);

(b) for each primary reservoir model, at least one flow distance ($Dmin_i$) according to the shortest path is determined by the shortest path computation algorithm;

(c) for each primary reservoir model, the breakthrough time ($TP_i$) is determined by a simulation using the primary reservoir model and a flow simulator; and (d) the mathematical relationship (REL) between the breakthrough time ($TP_i$) and the flow distance ($Dmin_i$) is determined from each determined flow distance and breakthrough time.

The steps (a) and (b) can be performed in that order, in the reverse order or simultaneously. The predetermined number of primary reservoir models is preferably reduced, in order to reduce the simulation time, and therefore the computation time of the method.

Preferably, the mathematical relationship is a linear relationship, FIG. 4 represents the link between the breakthrough time TP in days and the flow distance D in meters according to the shortest path. On this curve, a linearity can be exists between these two parameters.

According to the invention, the identification of the shortest path is performed without the use of a flow simulator. It involves using an effective method in terms of computation time to identify the shortest flow paths between the different wells. It therefore relies on a graph plotting and shortest path problem solving algorithm which is also called the shortest path computation algorithm.

The problems in computing the shortest path, also called routing problems, are conventional problems in graph theory. The objective is to compute a route between the summits of a graph which minimizes or maximizes a certain economic function. There are polynomial algorithms for solving this problem, such as the Dijkstra algorithm.

Advantageously, for each injection well, all the paths between the latter and its production wells, that is to say the production wells which are affected by the injector, are computed (the choice of the producers "linked" to the injector is made generally by looking at the exploitation scheme: in the case of a "five spot", the paths between the injection well and its production wells are computed, but the distance between these injection wells and a production well which forms part of another "five spot" more distant in the field is not computed: it is not useful).

This shortest path is dependent on the petrophysical and geological properties of the reservoir, notably the permeability, contained in the meshes of the models.

According to one embodiment of the invention, the Dijkstra algorithm is used to determine the flow distance between the injection well and the production well according to the shortest path. Other algorithms, such as the Ford-Bellman algorithm or the Gabow algorithm can be used for the method according to the invention. This list is not exhaustive.

In the present case, the meshes of the reservoir grid are likened to nodes interconnected by links. One important point is the evaluation of the length of the links. According to the invention, these lengths can be estimated as the ratio of the porous volume to the transmissivity. It will be recalled that, generally, the transmissivity $T_{ij}$ of the link connecting two adjacent meshes i and j has the value:

$$T_{i \leftrightarrow j} = \frac{A_{ij} K_{ij}}{D_{ij}} \text{ with } T_{i \leftrightarrow j} \text{ being}$$

the transmissivity between the meshes i and j, $A_{ij}$ being the intersection surface area between the meshes i and j, $K_{ij}$ being the mean permeability along the connection between the meshes i and j, and $D_{ij}$ being the distance between the meshes i and j. These different parameters must be explained according to the chosen discretization scheme. In all cases, this definition of the transmissivity implies that the length of a link is a function of static properties only and it is shown that the shortest path between two wells identified on the basis of this metric is different from the shortest flow path (FIG. 3a) represents a shortest flow path when a conventional length as a function of the logarithm of the permeability log 10(Perm) is taken into account).

According to the invention, the definition of the length of a link can be modified by incorporating therein information relating to the flow of the fluids. The ideal situation is to accurately compute the pressure field using a flow simulator. To reduce the computation times, the pressures are approached by solving the Darcy equation (for example using a flow simulation with a single time pitch). The length of a link between two adjacent meshes i and j becomes $$Length_{i \leftrightarrow j} = \frac{\sqrt{V p_i \times V p_j}}{T_{i \leftrightarrow j}(P_i - P_j)}$$

with $Vp_i$ being the porous volume of the mesh i, $Vp_j$ being the porous volume of the mesh j, $P_i$ being the pressure of the fluid present in the porous medium (it can be injected fluid and/or hydrocarbons) of the mesh i, and $P_j$ being the pressure of the fluid present in the porous medium of the mesh j.

An immediate consequence of this definition is the orientation of the links between the meshes of the reservoir. When the lengths are negative (case equivalent to a lift against the current), the corresponding links are cut. The impact on the identification of the shortest path between two wells is illustrated by FIG. 3b), which represents a shortest flow path if a length as defined above according to the logarithm of the permeability log 10(Perm) is taken into account. This definition of the length, even if it is applied to an approximation of the pressure field, makes it possible to consistently identify the shortest flow path between two wells. This consistency can be observed from FIG. 3c) which represents the water saturation (Sw) at the breakthrough time for the field of permeability of FIGS. 3a) and 3b). In fact, in this figure, it can be seen that the shortest path of FIG. 3a) cannot be observed whereas that of FIG. 3b) does indeed correspond to the circulation of the water.

During this step, according to this approach, the shortest flow paths between the pairs (injection wells, production wells) are identified and the distance of these shortest paths is computed.

According to an alternative embodiment, instead of estimating the breakthrough time, it is possible to estimate a breakthrough time probability. In this case, when the probability law and the measured breakthrough time are compared, the difference can be quantified from the surface of the probability law between the measured breakthrough time and the most probable breakthrough time as defined by this probability law.

By means of this step (and for the different embodiments), a first reservoir model is obtained for which the estimated breakthrough time is consistent with the measured breakthrough time.

2) Minimization of the Objective Function (FOB)

At this stage, all the collected dynamic data (DD) has not been considered in constructing the reservoir model. All of the dynamic data acquired during exploitation of the deposit are now considered. These are production, well testing, 4D seismic and other such data, the particular feature of which is that they vary over time as a function of the fluid flows in the reservoir.

These dynamic data will then be integrated in the reservoir model through an optimization or history matching (CAL). An objective function (FOB) is therefore defined that measures the difference between the dynamic data (DD) measured in the field and the corresponding simulated responses (SIM) for the model under study (MR) by use of a flow simulator. Among the flow simulators that can be used, is the PumaFlow® (IFP Energies nouvelles, France) software. The aim of the optimization process is to modify the model (MR) incrementally to minimize the objective function (FOB). For this, the steps of simulation (SIM) and of computation of the objective function (FOB) are reiterated after having modified the reservoir models (MR). According to the invention, the history matching begins with the first reservoir model determined in the preceding step.

Preferably, the objective function is determined by a measurement of the least squares type which quantifies the difference between simulated data and responses. Advantageously, an objective function J can be defined which measures the error between the reference water flow rates (d) and the simulated water flow rates (g(m)) for the reservoir model m being tested:

$$J(m) = \frac{1}{2}\sum_{i}(g(m)_i - d_i)^2$$

According to the invention, in order to be able to correctly simulate the flows in the reservoir, a step of upscaling of the reservoir model to a coarse reservoir model, called the simulation model, can be performed.

Advantageously, to modify the reservoir model, it is possible to use a gradual deformations method, a pilot points method or a probability perturbation method. This list is not exhaustive.

3) Determination of the Exploitation Scheme (SE)

From the reservoir model determined in the preceding steps, several exploitation schemes (SE) can be determined which correspond to different possible subterranean reservoir exploitation configurations: placement of the production and/or injection wells, target values for the flow rates for each well and/or for the reservoir, the types of software tools used, the fluids used, injected and/or recovered, and so on. For each of these schemes, their production forecasts after the matching period should be determined. These probabilistic production forecasts are obtained by flow simulation software (preferably the same as that used previously) and by use of the matched numerical reservoir model.

One or more possible exploitation schemes (SE) are defined that are suited to the reservoir model (also called geological model). For each of these schemes, the responses are determined by simulation.

From the probabilistic production forecasts defined for each exploitation scheme, comparison can be used to choose the exploitation scheme which seems to them most relevant. For example:

by comparing the maximum of the recovered oil volume, it is possible to determine the production scheme likely to provide the maximum recovery or to be the most cost-effective.

by comparing the standard deviation of the recovered oil volume, it is possible to determine the least risky production scheme.

4) Exploitation (EX) of the Reservoir

The reservoir is then exploited (EX) according to the defined exploitation scheme (SE) for example by drilling new wells (production or injection), by modifying the tools used, by modifying the flow rates and/or the nature of the fluids injected, etc.

The invention relates moreover to a computer program product that can be downloaded from a communication network and/or stored on a computer-readable medium and/or that can be executed by a processor. This program comprises program code instructions for implementing the method as described above, when the program is executed on a computer.

Example of an Application

In order to show the benefit of this method for the exploitation of hydrocarbon deposits, the method can be applied to a simplified oil field case. The field of permeability represented in FIG. 5 is considered as the reference field. The exploitation scheme is based on a central well INJ where water is injected and four production wells are located (P1 to P4) in the corners. The reservoir is initially saturated with oil. The relative permeability curves correspond to Corey curves with exponents set at 2. The water flow rates (Wc) produced at the production wells as a function of the time T have been computed on the basis of a flow simulator (FIG. 6). These flow rates are considered as reference data. In this graph, the breakthrough time corresponds to the time from which the flow rate increases greatly.

It is now assumed that the permeability field is not known. The available information comprises the characteristics of the spatial structure of the permeability field (mean, variance, variogram) and the reference water flow rates.

The method according to the embodiment of FIG. 2 is applied. Twenty primary reservoir models that observe the spatial structure are generated at random. For each of them, a preferential flow path is identified (by taking into account an approximate pressure field), its length is identified, and a flow simulation is conducted to obtain the breakthrough times at the production wells. A linear relationship between length of the flow path and breakthrough time for each of the wells is then revealed (FIGS. 7a) to 7d)) with a correlation coefficient greater than 0.9.

A more conventional matching scheme is then applied to construct a reservoir model that observes not only the variogram of the permeability field, but also the reference water flow rates. With this in mind, an objective function J is defined which measures the error between the reference water flow rates (d) and the simulated water flow rates (g(m)) for the reservoir model m tested:

$$J(m) = \frac{1}{2} \sum_i (g(m)_i - d_i)^2.$$

The objective to be reached is the minimization of this function by iteratively modifying the reservoir model. On each iteration, the objective function is evaluated on the basis of a flow simulation. To be able to start the matching process, there must be a starting point, that is to say an initial reservoir model.

Two tests are performed. For the first, the starting point is drawn at random according to the a priori probability law, as implemented according to the prior art methods. For the second test, the method according to the invention is applied with the preselection step, such that a first reservoir model is preselected for which the breakthrough times deduced from the lengths of the shortest flow paths between wells are close to the reference breakthrough times. The trend of the objective function (FOB) as a function of the number of simulations (Nsim) during the matching process is shown in FIG. 8 for both cases. Curve AA is for the method without preselection and curve INV is for the method according to the invention. For the first test (AA), the objective function starts at 35 and reaches approximately 6 after 240 flow simulations. It will also be noted that approximately 200 simulations are needed to reduce it to 10. For the second test (INV), the preselection step which has required, all in all, 20 flow simulations, the objective function starts at 10. Then, it decreases to finally tend toward 1 in 240 simulations. This test well underlines the benefit of the proposed method for preselecting initial models. Ultimately, the preselection makes it possible to improve the production data matching phase.

The invention claimed is:

1. A method for exploiting a geological reservoir according to an exploitation scheme defined using a reservoir model comprising a meshing associated with at least one parameter of the reservoir, the reservoir being passed through by at least one production well and at least one injection well for the injection of at least one fluid into the reservoir, with dynamic data being acquired during exploitation, the method comprising:
    a) generating a first reservoir model for which a breakthrough time is estimated by the first reservoir model which is representative of the breakthrough time measured for the reservoir, the breakthrough time being a time elapsed at which the injected fluid is detected at the at least one production well;
    b) the first reservoir model is implemented by execution of program instructions on a computer and is constructed by modifying the first reservoir model by steps of:
        i) determining an objective function that measures a difference between acquired dynamic data and dynamic data simulated by the first reservoir model and a flow simulator;
        ii) reiterating step i) to minimize the objective function after modification of the first reservoir model;
    c) determining an optimal exploitation scheme for the reservoir by simulating exploitation of the reservoir by the first reservoir model and of the flow simulator; and
    d) exploiting the reservoir by implementing the optimal exploitation scheme; and wherein the first reservoir model is generated by:
        (1) determining a mathematical relationship between the breakthrough time and a flow distance according to a shortest path between the injection well and the production well;
        (2) randomly generating at least one initial reservoir model;
        (3) for the initial reservoir model, determining the flow distance according to a shortest path between the injection well and the production well by using a shortest path computation algorithm which is constrained by the parameters of the initial reservoir model;
        (4) estimating the breakthrough time for the initial reservoir model by using the flow distance and the mathematical relationship;
        (5) the estimated breakthrough time is compared to the measured breakthrough time; and
        (6) determining whether the initial reservoir model is representative with the comparison; and wherein the initial reservoir model is selected as the first reservoir model and, if not, steps (2) to (5) are reiterated.

2. A method according to claim 1 comprising estimating the breakthrough time by use of a shortest path computation algorithm.

3. A method according to claim 2 comprising determining the mathematical relationship between the breakthrough time and the flow distance by performing the steps:
    (a) randomly generating at least one primary reservoir model;
    (b) determining for each primary reservoir model at least one flow distance according to the shortest path by use of the shortest path computation algorithm;
    (c) determining for each primary reservoir model the breakthrough time by a simulation using the primary reservoir model and the flow simulator; and
    (d) determining the mathematical relationship between the breakthrough time and the flow distance by use of each determined flow distance and breakthrough time.

4. A method according to claim 2, wherein prior to a determination of the objective function, performing an upscaling of the reservoir model is performed for the simulation.

5. A method according to claim 2, wherein the objective function measures an error between a flow rate of the fluid measured at the production well and a flow rate of the fluid simulated at the production well.

6. A method according to claim 3, wherein the mathematical relationship is a linear function.

7. A method according to claims 3, wherein the shortest path computation algorithm is a Dijkstra algorithm.

8. A method according to claims 6, wherein the shortest path computation algorithm is a Dijkstra algorithm.

9. A method according to claim 6, in which length of a link between two adjacent meshes i and j used by the shortest path algorithm is defined by a formula as follows:

$$Length_{i\rightarrow j} = \frac{\sqrt{Vp_i \times Vp_j}}{T_{i\leftrightarrow j}(P_i - P_j)} \text{ with } T_{i\leftrightarrow j} = \frac{A_{ij}K_{ij}}{D_{ij}}$$

with Ti←→j being a transmissivity between the meshes i and j,
Aij being an intersection surface area between the meshes i and j,
Dij being a distance between the meshes i and j,
Kij being a mean permeability along the connection between the meshes i and j,
Vpi being a porous volume of the mesh i,
Vpj being a porous volume of the mesh j,
Pi being the fluid pressure in the mesh i, and
Pj being the fluid pressure in the mesh j.

10. A method according to claim 6 comprising determining the mathematical relationship between the breakthrough time and the flow distance by performing the steps:
    (a) randomly generating at least one primary reservoir model;
    (b) determining for each primary reservoir model at least one flow distance according to the shortest path by use of the shortest path computation algorithm;
    (c) determining for each primary reservoir model the breakthrough time by a simulation using the primary reservoir model and the flow simulator; and
    (d) determining the mathematical relationship between the breakthrough time and the flow distance by use of each determined flow distance and breakthrough time.

11. A method according to claim 1 comprising determining the mathematical relationship between the breakthrough time and the flow distance by performing the steps:
    (a) randomly generating at least one primary reservoir model;
    (b) determining for each primary reservoir model at least one flow distance according to the shortest path by use of the shortest path computation algorithm;
    (c) determining for each primary reservoir model the breakthrough time by a simulation using the primary reservoir model and the flow simulator; and
    (d) determining the mathematical relationship between the breakthrough time and the flow distance by use of each determined flow distance and breakthrough time.

12. A method according to claim 11, wherein the mathematical relationship is a linear function.

13. A method according to claims 11, wherein the shortest path computation algorithm is a Dijkstra algorithm.

14. A method according to claim 11, in which length of a link between two adjacent meshes i and j used by the shortest path algorithm is defined by a formula as follows:

$$Length_{i\rightarrow j} = \frac{\sqrt{Vp_i \times Vp_j}}{T_{i\leftrightarrow j}(P_i - P_j)} \text{ with } T_{i\leftrightarrow j} = \frac{A_{ij}K_{ij}}{D_{ij}}$$

with Ti←→j being a transmissivity between the meshes i and j,
Aij being an intersection surface area between the meshes i and j,
Dij being a distance between the meshes i and j,
Kij being a mean permeability along the connection between the meshes i and j,
Vpi being a porous volume of the mesh i,
Vpj being a porous volume of the mesh j,
Pi being the fluid pressure in the mesh i, and
Pj being the fluid pressure in the mesh j.

15. A method according to claim 11, wherein prior to a determination of the objective function performing an upscaling of the reservoir model is performed for the simulation.

16. A method according to claim 11, wherein the objective function measures an error between a flow rate of the fluid measured at the production well and a flow rate of the fluid simulated at the production well.

17. A method according to claim 13 comprising determining the mathematical relationship between the breakthrough time and the flow distance by performing the steps:
    (a) randomly generating at least one primary reservoir model;
    (b) determining for each primary reservoir model at least one flow distance according to the shortest path by use of the shortest path computation algorithm;
    (c) determining for each primary reservoir model the breakthrough time by a simulation using the primary reservoir model and the flow simulator; and
    (d) determining the mathematical relationship between the breakthrough time and the flow distance by use of each determined flow distance and breakthrough time.

18. A method according to claims 12, wherein the shortest path computation algorithm is a Dijkstra algorithm.

19. A method according to claim 12, in which length of a link between two adjacent meshes i and j used by the shortest path algorithm is defined by a formula as follows:

$$Length_{i\rightarrow j} = \frac{\sqrt{Vp_i \times Vp_j}}{T_{i\leftrightarrow j}(P_i - P_j)} \text{ with } T_{i\leftrightarrow j} = \frac{A_{ij}K_{ij}}{D_{ij}}$$

with Ti←→j being a transmissivity between the meshes i and j,
Aij being an intersection surface area between the meshes i and j,
Dij being a distance between the meshes i and j,
Kij being a mean permeability along the connection between the meshes i and j,
Vpi being a porous volume of the mesh i,
Vpj being a porous volume of the mesh j,
Pi being the fluid pressure in the mesh i, and
Pj being the fluid pressure in the mesh j.

20. A method according to claim 12, wherein prior to a determination of the objective function performing an upscaling of the reservoir model is performed for the simulation.

21. A method according to claim 12, wherein the objective function measures an error between a flow rate of the fluid measured at the production well and a flow rate of the fluid simulated at the production well.

22. A method according to claim 12 comprising determining the mathematical relationship between the breakthrough time and the flow distance by performing the steps:
    (a) randomly generating at least one primary reservoir model;
    (b) determining for each primary reservoir model at least one flow distance according to the shortest path by use of the shortest path computation algorithm;

(c) determining for each primary reservoir model the breakthrough time by a simulation using the primary reservoir model and the flow simulator; and (d) determining the mathematical relationship between the breakthrough time and the flow distance by use of each determined flow distance and breakthrough time.

23. A method according to claim 1, in which length of a link between two adjacent meshes i and j used by the shortest path algorithm is defined by a formula as follows:

$$Length_{i \to j} = \frac{\sqrt{V_{p_i} \times V_{p_j}}}{T_{i \leftrightarrow j}(P_i - P_j)} \text{ with } T_{i \leftrightarrow j} = \frac{A_{ij} K_{ij}}{D_{ij}}$$

with $T_{i \leftrightarrow j}$ being a transmissivity between the meshes i and j, $A_{ij}$ being an intersection surface area between the meshes i and j, $D_{ij}$ being a distance between the meshes i and j, $K_{ij}$ being a mean permeability along the connection between the meshes i and j, $V_{pi}$ being a porous volume of the mesh i, $V_{pj}$ being a porous volume of the mesh j, $P_i$ being the fluid pressure in the mesh i, and $P_j$ being the fluid pressure in the mesh j.

24. A method according to claim 23, wherein prior to a determination of the objective function performing an upscaling of the reservoir model is performed for the simulation.

25. A method according to claim 23, wherein the objective function measures an error between a flow rate of the fluid measured at the production well and a flow rate of the fluid simulated at the production well.

26. A method according to claim 23 comprising determining the mathematical relationship between the breakthrough time and the flow distance by performing the steps:

(a) randomly generating at least one primary reservoir model;

(b) determining for each primary reservoir model at least one flow distance according to the shortest path by use of the shortest path computation algorithm;

(c) determining for each primary reservoir model the breakthrough time by a simulation using the primary reservoir model and the flow simulator; and (d) determining the mathematical relationship between the breakthrough time and the flow distance by use of each determined flow distance and breakthrough time.

27. A method according to claim 24 comprising determining the mathematical relationship between the breakthrough time and the flow distance by performing the steps:

(a) randomly generating at least one primary reservoir model;

(b) determining for each primary reservoir model at least one flow distance according to the shortest path by use of the shortest path computation algorithm;

(c) determining for each primary reservoir model the breakthrough time by a simulation using the primary reservoir model and the flow simulator; and (d) determining the mathematical relationship between the breakthrough time and the flow distance by use of each determined flow distance and breakthrough time.

28. A method according to claim 1, wherein prior to a determination of the objective function, performing an upscaling of the reservoir model for the simulation.

29. A method according to claim 28, wherein the objective function measures an error between a flow rate of the fluid measured at the production well and a flow rate of the fluid simulated at the production well.

30. A method according to claim 28 comprising determining the mathematical relationship between the breakthrough time and the flow distance by performing the steps:

(a) randomly generating at least one primary reservoir model;

(b) determining for each primary reservoir model at least one flow distance according to the shortest path by use of the shortest path computation algorithm;

(c) determining for each primary reservoir model the breakthrough time by a simulation using the primary reservoir model and the flow simulator; and (d) determining the mathematical relationship between the breakthrough time and the flow distance by use of each determined flow distance and breakthrough time.

31. A method according to claim 1, wherein the objective function measures an error between a flow rate of the fluid measured at the production well and a flow rate of the fluid simulated at the production well.

32. A method according to claim 1, comprising modifying the reservoir model by use of a gradual deformations method, a pilot points method or a probability perturbation method.

33. A method according to claim 32 comprising determining the mathematical relationship between the breakthrough time and the flow distance by performing the steps:

(a) randomly generating at least one primary reservoir model;

(b) determining for each primary reservoir model at least one flow distance according to the shortest path by use of the shortest path computation algorithm;

(c) determining for each primary reservoir model the breakthrough time by a simulation using the primary reservoir model and the flow simulator; and (d) determining the mathematical relationship between the breakthrough time and the flow distance by use of each determined flow distance and breakthrough time.

34. A computer program product comprising a non-transitory computer readable storage medium for storing program code instructions for execution by a processor, for implementing the method of claim 1 when executed on a computer.

* * * * *